(12) United States Patent
Ikegaya

(10) Patent No.: US 10,308,197 B2
(45) Date of Patent: Jun. 4, 2019

(54) ELECTRIC DISTRIBUTION BOX

(71) Applicant: Yazaki Corporation, Tokyo (JP)

(72) Inventor: Koji Ikegaya, Makinohara (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 16/118,585

(22) Filed: Aug. 31, 2018

(65) Prior Publication Data

US 2019/0118746 A1    Apr. 25, 2019

(30) Foreign Application Priority Data

Oct. 25, 2017   (JP) .................................. 2017-206538

(51) Int. Cl.

| | |
|---|---|
| *H01R 12/00* | (2006.01) |
| *B60R 16/023* | (2006.01) |
| *H05K 7/06* | (2006.01) |
| *H02G 3/16* | (2006.01) |

(52) U.S. Cl.

CPC .......... *B60R 16/0238* (2013.01); *H02G 3/16* (2013.01); *H05K 7/06* (2013.01); *H01R 2201/26* (2013.01)

(58) Field of Classification Search

CPC ........ B60R 16/0238; H02G 3/16; H05K 7/06; H01R 9/00; H01R 2201/26
USPC ................................................ 439/76.1, 76.2
See application file for complete search history.

(56) References Cited

U.S. PATENT DOCUMENTS

| | | | | |
|---|---|---|---|---|
| 8,824,164 B2 * | 9/2014 | Sakita | .................... | H05K 3/368 174/250 |
| 8,835,760 B2 * | 9/2014 | Saimoto | ................. | H01R 13/42 174/50 |
| 8,895,876 B2 * | 11/2014 | Makino | .................. | H01R 9/223 174/520 |
| 8,907,213 B2 * | 12/2014 | I | .......................... | B60R 16/0238 174/50 |
| 9,019,723 B2 * | 4/2015 | Hattori | ................ | B60R 16/0238 361/823 |

FOREIGN PATENT DOCUMENTS

| | | |
|---|---|---|
| JP | 2014-217253 A | 11/2014 |
| JP | 2015-6054 A | 1/2015 |

* cited by examiner

*Primary Examiner* — Khiem M Nguyen

(74) *Attorney, Agent, or Firm* — Sughrue Mion, PLLC

(57) ABSTRACT

An electric distribution box includes a substrate, a first connector fitting part which includes first terminals, wherein one end portions of the first terminals are electrically connected to the substrate and the other end portions of the first terminals are disposed above the substrate so as to fit with the first connectors in a fitting direction parallel to the substrate, a second connector fitting part which includes a second terminal, wherein one end portion of the second terminal is electrically connected to the substrate and the other end portion of the second terminal is disposed above the substrate so as to fit with the second connector in a direction opposite to the fitting direction, electronic components on the substrate, a case body, and a cover which closes an opening part of the case body.

3 Claims, 8 Drawing Sheets

ELECTRIC DISTRIBUTION BOX

CROSS REFERENCE TO RELATED APPLICATIONS

This application is based on Japanese Patent Application (No. 2017-206538) filed on Oct. 25, 2017, the contents of which are incorporated herein by reference.

BACKGROUND OF THE INVENTION

1. Field of the Invention

The present invention relates to an electric distribution box.

2. Description of the Related Art

An electric distribution box that distributes electric power from an alternator and a battery to each auxiliary device is mounted on a vehicle. In an electric distribution box disclosed in JP-A-2014-217253, a connector fitting part and a second electronic component having a large dimension in a thickness direction of a substrate are disposed on the same surface of the substrate and at positions not aligned in a fitting direction, and the components may be effectively disposed while reducing an entire size of the substrate. Further, in an electric distribution box disclosed in JP-A-2015-6054, a terminal holding part and a plurality of substrate connecting parts are disposed between a row of certain electronic components and a row of electronic components adjacent thereto, so that a distance of the a wiring pattern is minimized and an size of the substrate is reduced.

However, in a case where an electronic component with a high height such as a diode or a capacitor is provided in a conventional electric distribution box, a fitting space of a connector is restricted and it is difficult to reduce the size. Further, as in the traditional configuration, it is insufficient to reduce the size only by shifting the electronic component with a high height and the connector fitting part to positions not aligned in the fitting direction.

Further, in a traditional configuration, since a plurality of connector fitting parts are aligned one same surface side, and a plurality of cables connected to the connectors are pulled out from the connector fitting part, and therefore, it is difficult to fit the connectors.

SUMMARY OF THE INVENTION

The present invention has been made in view of the above conditions, and an object thereof is to provide an electric distribution box in which components can be effectively disposed in a relatively small space, and fitting work of each connector becomes easier.

The above object according to the present invention is achieved by the following configurations.

(1) An electric distribution box, includes: a substrate; a first connector fitting part which includes a plurality of first terminals and a terminal holding part which holds the plurality of first terminals, in which one end portions of the first terminals are electrically connected to the substrate and the other end portions of the first terminals are electrically connected to terminals of a plurality of first connectors respectively, and the other end portions of the plurality of first terminals are disposed above the substrate so as to fit with the plurality of first connectors in a fitting direction parallel to the substrate; a second connector fitting part which includes a second terminal, in which one end portion of the second terminal is electrically connected to the substrate and the other end portion of the second terminal is configured to be electrically connected to a terminal of a second connector, and the other end portion of the second terminal is disposed above the substrate so as to fit with the second connector in a direction opposite to the fitting direction of the first connector; a plurality of electronic components which is surface-mounted on the substrate; a bottomed tubular case body which integrally forms a second connector accommodating part configured to accommodate the second connector on a bottom wall thereof, and accommodates the substrate inserted from a direction same as the fitting direction of the first connectors; and a cover which integrally forms a first connector accommodating part configured to accommodate the plurality of first connectors, and closes an opening part of the case body.

According to the electric distribution box of (1), the plurality of first connectors are fitted to the first connector accommodating part disposed on the cover which is on the opposite side of the bottom wall of the case body to which the second connector is connected, and therefore, fitting work of the first connectors becomes easier compared to a related electric distribution box in which all connectors are connected to the same one surface.

Further, since the fitting direction of the first connector with respect to the first connector fitting part is opposite to the fitting direction of the second connector with respect to the second connector fitting part, an electronic component with a high height can be disposed at a position aligned in a fitting direction of a connector with respect to at least one of the first connector fitting part and the second connector fitting part, and a substrate space of the substrate can be effectively utilized so as to reduce the size.

The first connector fitting part, the second connector fitting part and the electronic components are all surface-mounted on the same surface of the substrate, so that a terminal or a component does not protrude on a side opposite to the mounting surface, and the case body can be compact in a height direction.

(2) The electric distribution box according to (1), in which the first connector fitting part and the second connector fitting part are arranged in a direction orthogonal to the fitting direction and in a direction parallel to the substrate; and at least one of the electronic components is disposed between the first connector accommodating part and the substrate, between the second connector accommodating part and the substrate, as well as between the second connector accommodating part and the cover.

According to the electric distribution box of (2), the electronic components are disposed between the first connector accommodating part and the substrate, between the second connector accommodating part and the substrate, as well as between the second connector accommodating part and the cover, so that a space in the case body can be effectively utilized and the size can be reduced. In particular, an electronic component whose dimension in the thickness direction of the substrate is larger than other electronic components can be disposed between the second connector accommodating part and the cover.

(3) The electric distribution box according to (1) or (2), in which the second connector is connected to a module cable of a control box connected to a trunk line extending in a front-rear direction of a vehicle; the plurality of first connectors are respectively connected to connection cables respectively connected to auxiliary devices of a vehicle module disposed in the vehicle; and power and a signal supplied from the second connector are distributed to the plurality of first connectors separately.

According to the electric distribution box of (3), the power and the signal supplied from the module cable connected to the control box via the trunk line are distributed to connection cables which are connected to the auxiliary devices of each vehicle module in the vehicle, so that a versatile and compact electric distribution box is provided.

According to the electric distribution box of the present invention, components can be effectively disposed in a relatively small space, and fitting work of each connector becomes easier.

The present invention has been briefly described above. Further, details of the present invention will be clarified by reading a mode (hereinafter, referred to as "embodiment") for carrying out the invention described below with reference to attached drawings.

DETAILED DESCRIPTION OF THE EXEMPLARY EMBODIMENTS

Hereinafter, embodiments of the present invention will be described with reference to the drawings.

Figure 1:
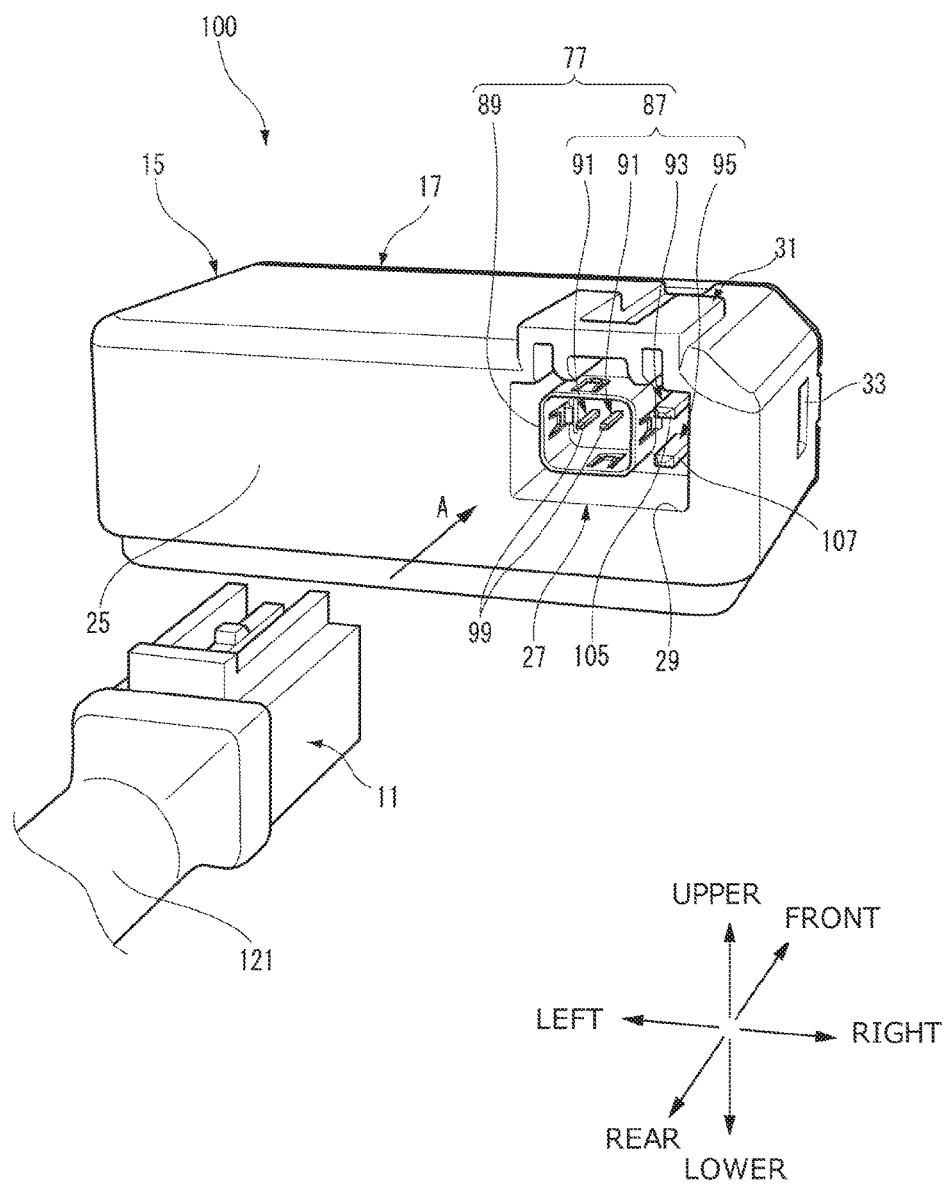
FIG. 1 is a perspective view showing an electric distribution box according to an embodiment of the present invention together with a second connector.
Figure 2:
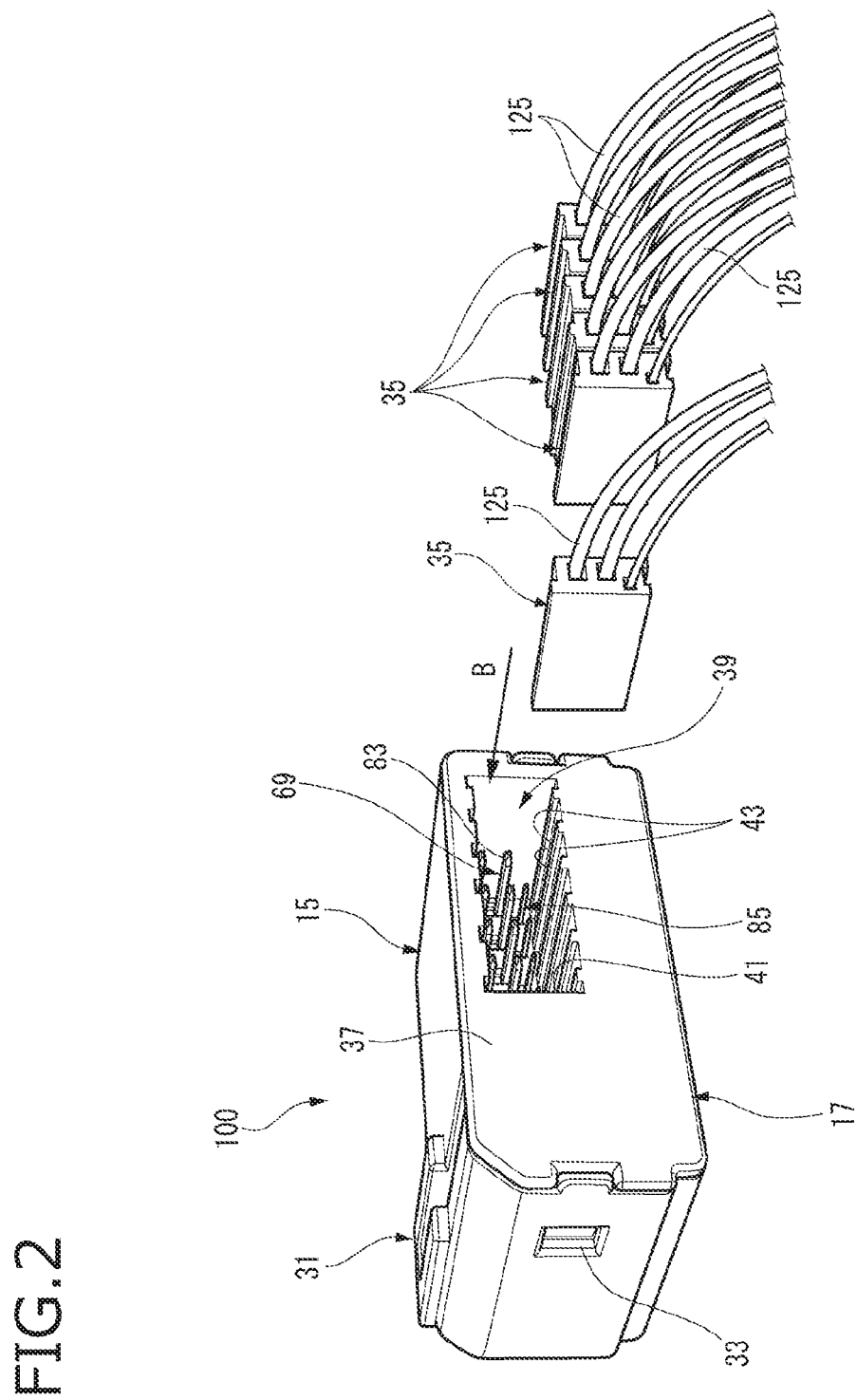
FIG. 2 is a perspective view showing the electric distribution box together with a first connector as viewed from an opposite side of FIG. 1.
Figure 3:
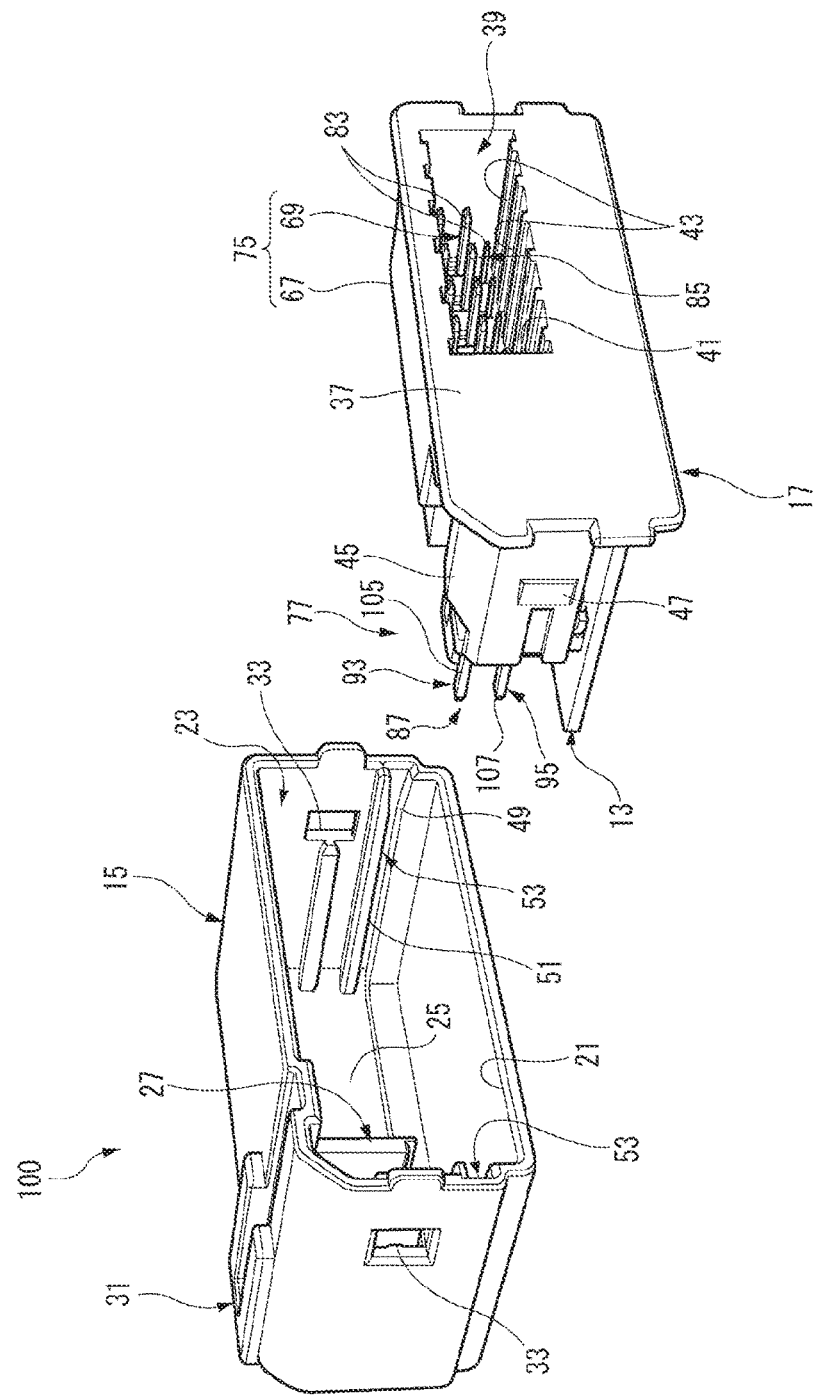
FIG. 3 is an exploded perspective view of the electric distribution box shown in FIG. 2.

FIG. 1 is a perspective view showing an electric distribution box 100 according to an embodiment of the present invention together with a second connector 11. FIG. 2 is a perspective view showing the electric distribution box 100 together with a first connector 35 as viewed from an opposite side (front side) of FIG. 1. FIG. 3 is an exploded perspective view of the electric distribution box 100 shown in FIG. 2.

In the present embodiment, directions of upper and lower, front and rear, left and right follow the directions of arrows shown in FIG. 1.

As shown in FIGS. 1 to 3, the electric distribution box 100 according to the present embodiment includes a substrate 13, a case body 15, and a cover 17 as main members.

The case body 15 of the present embodiment is integrally formed of an electrically insulating synthetic resin. The case body 15 is formed into a bottomed square tubular shape such that the substrate 13 is inserted into and accommodated in a substrate accommodating space 23 located inside from an opening part 21 (see FIG. 3).

A bottom wall 25 is provided on a side opposite to the opening part 21 of the case body 15. As shown in FIG. 1, a second connector accommodating part 27 for accommodating the second connector 11 is integrally formed on a right end of the bottom wall 25. The second connector accommodating part 27 is opened as a rectangular second connector insertion opening part 29 on the bottom wall 25. The second connector 11 is fitted into the second connector accommodating part 27 in a fitting direction A.

A lock part 31 for holding the second connector 11 in a fitted state is formed on the case body 15 at an upper portion of the second connector accommodating part 27. Further, a cover locking part 33 in a square window shape for locking and holding the cover 17 is formed on left and right side walls of the case body 15.

As shown in FIG. 2 and FIG. 3, the cover 17 including a cover body 37 integrally formed of an electrically insulating synthetic resin is attached to the opening part 21 of the case body 15. The cover body 37 is formed into a rectangular plate shape which is long in a left-right direction so as to close the opening part 21. A first connector accommodating part 39 for accommodating a plurality of (six in the present embodiment) first connectors 35 is integrally formed on a left end of the cover body 37. The first connector accommodating part 39 is opened as a rectangular first connector insertion opening part 41 which is long in the left-right direction on the cover body 37. In the present embodiment, the plurality of the first connectors 35 is aligned in the left-right direction. Therefore, a plurality of accommodating chambers 43 for accommodating the first connectors 35 aligned in the left-right direction is formed in the first connector accommodating part 39. A fitting direction B of the first connector 35 is the same as the direction in which the substrate 13 is inserted.

Figure 4:
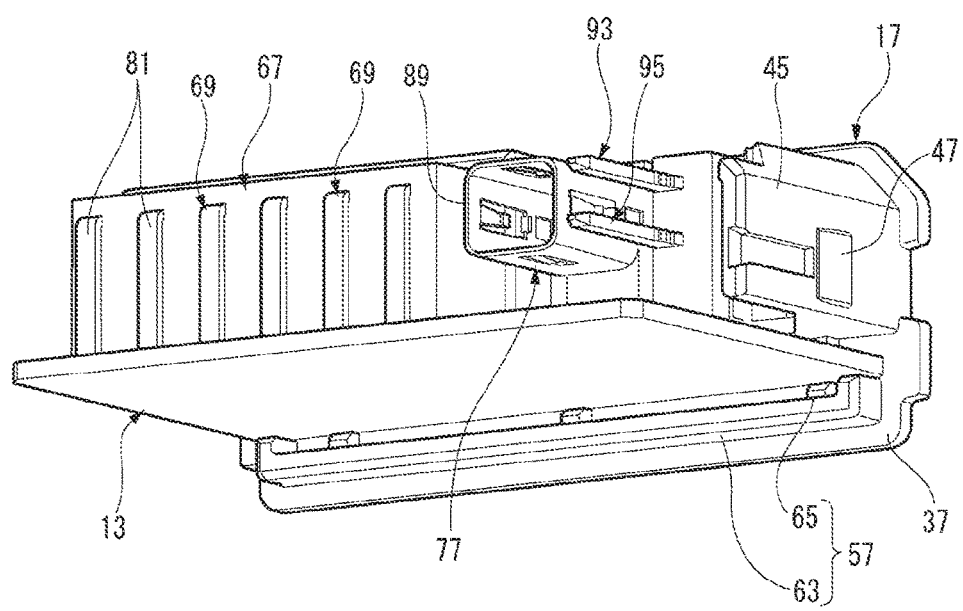
FIG. 4 is a perspective view of a cover and a substrate shown in FIG. 3 as viewed from an opposite side.

As shown in FIG. 3 and FIG. 4, an insertion guide part 45 protrudes from left and right of a back surface of the cover body 37 toward a direction in which the cover body 37 is inserted into the case body 15. A locking protrusion 47 to be locked to the cover locking part 33 is formed on a guide side surface of the insertion guide part 45. The cover body 37 can hold the substrate 13 on a lower side of the insertion guide part 45. That is, the substrate 13 can be inserted into the substrate accommodating space 23 of the case body 15 in a state where a front edge of the substrate 13 is held by the cover 17. At this time, the case body 15 is formed with a substrate guide groove 53 which guides the substrate 13 while clamping left and right side edges thereof in a thickness direction. The substrate guide groove 53 is configured by a lower slide-contact part 49 and an upper slide-contact part 51.

FIG. 4 is a perspective view of the cover 17 and the substrate 13 shown in FIG. 3 as viewed from an opposite side (rear side).

In the cover 17 of the present embodiment, the substrate 13 held at the back surface of the cover body 37 is disposed between a pair of insertion guide parts 45 provided on left and right sides of the cover body 37. Therefore, the substrate 13 and mounted components mounted on the substrate 13 can be smoothly inserted into the substrate accommodating space 23 without interfering with the opening part 21 of the case body 15.

Figure 5:
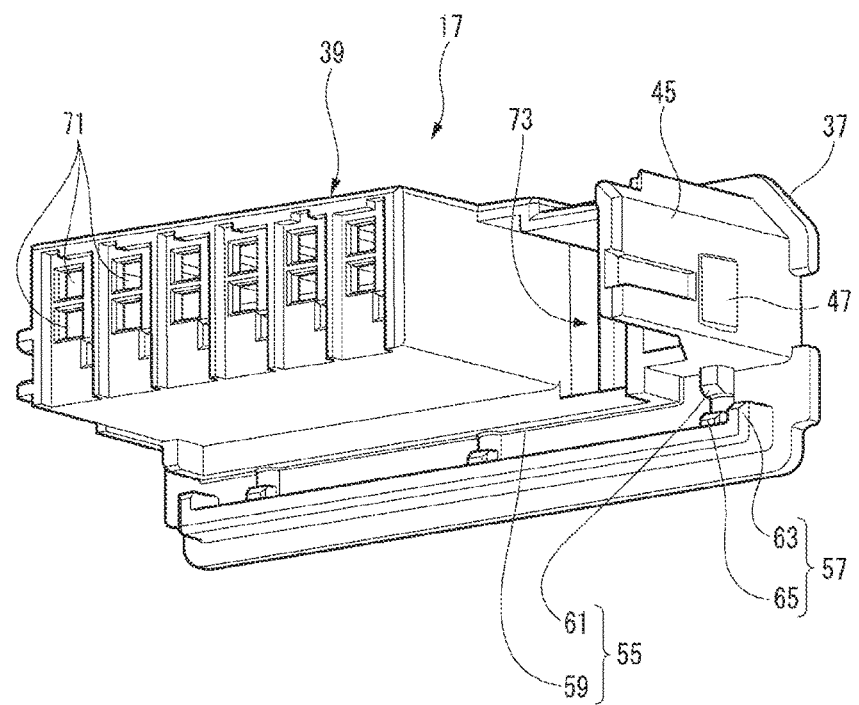
FIG. 5 is a perspective view of the cover in which the substrate shown in FIG. 4 is omitted.

FIG. 5 is a perspective view of the cover 17 in which the substrate 13 shown in FIG. 4 is omitted.

On the back surface of the cover body 37, an upper surface supporting part 55 and a lower surface supporting part 57 are formed so as to clamp the front edge of the substrate 13 from a side of a mounting surface and a side opposite to the side of the mounting surface. The upper surface supporting part 55 includes an upper surface supporting frame 59 and an upper rib 61. The lower surface supporting part 57 includes a lower surface supporting frame 63 and a lower rib 65. The front edge of the substrate 13 is clamped from an upper-lower direction and held on the cover 17 by the upper surface supporting part 55 and the lower surface supporting part 57 (see FIG. 4).

On the back surface of the cover body 37, the first connector accommodating part 39 protrudes along the fitting direction B on an upper side of the upper surface supporting part 55. The inside of the first connector accommodating part 39 is the plurality of accommodating chambers 43 into which the plurality of first connectors 35 is inserted. A plurality of (twelve locations in the present embodiment) terminal insert opening parts 71 into which first terminals 69 (see FIG. 6) protruding from a terminal holding part 67 (see FIG. 6) described later are inserted is formed on a back surface of the first connector accommodating part 39.

In the cover body 37, a relief part 73 is defined between the terminal insert opening part 71 and the right insertion guide part 45. The relief part 73 can accommodate a high-height electronic component 113 which is an electronic component with a high height such as a diode and a capacitor described later.

Figure 6:
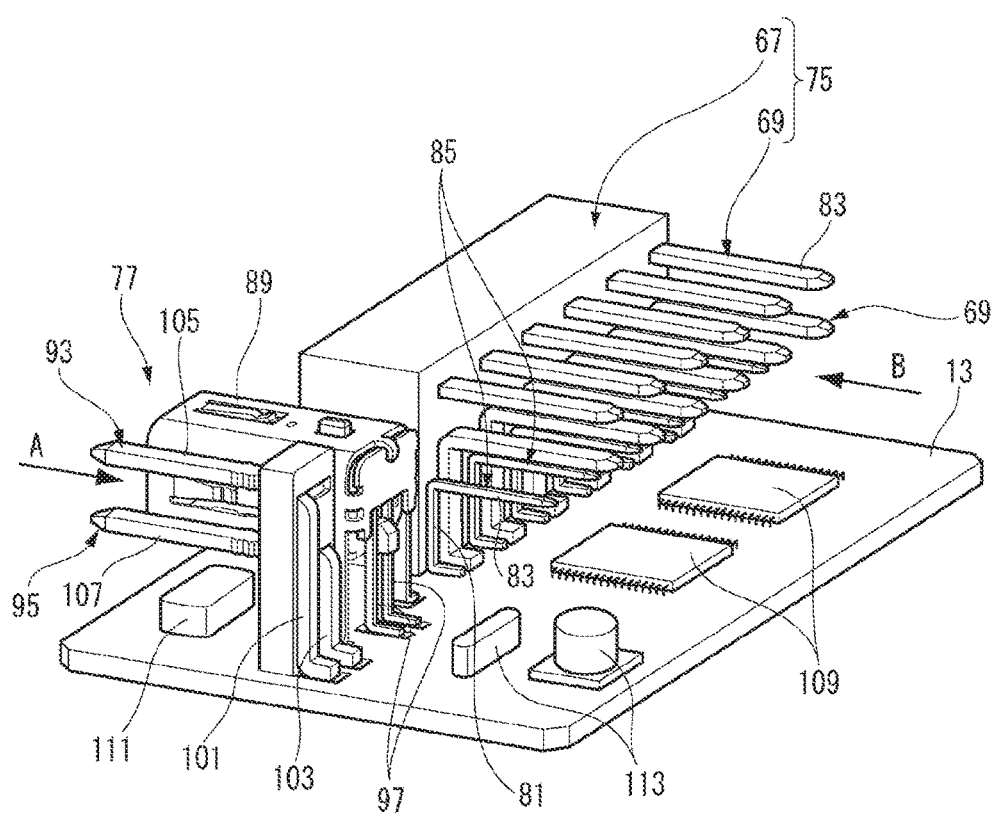
FIG. 6 is an overall perspective view of the substrate shown in FIG. 4.
Figure 7:
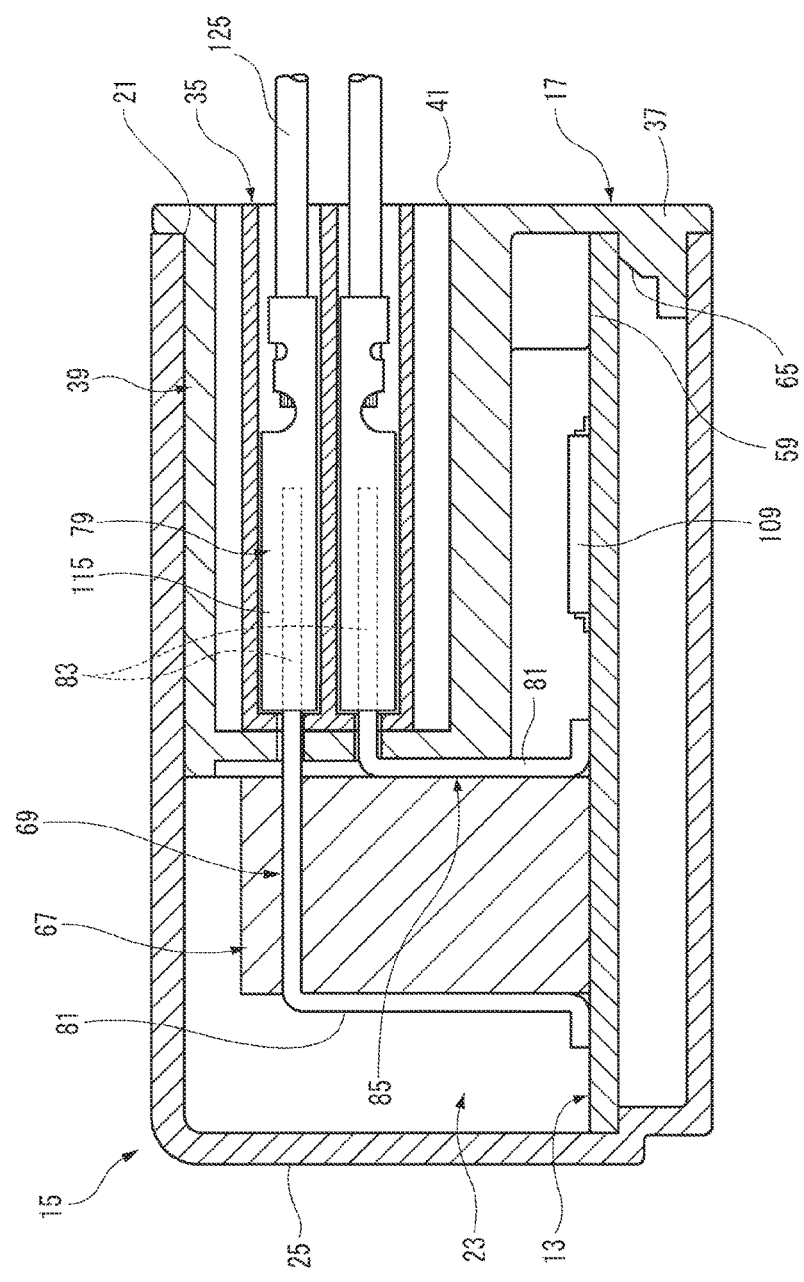
FIG. 7 is a longitudinal sectional view of the electric distribution box shown in FIG. 1.

FIG. 6 is an overall perspective view of the substrate 13 shown in FIG. 4. FIG. 7 is a longitudinal sectional view, which is parallel to the upper-lower direction and a front-rear direction, of the electric distribution box 100 shown in FIG. 1.

The substrate 13 of the present embodiment is provided with a first connector fitting part 75 and a second connector fitting part 77. The first connector fitting part 75 includes a plurality of first terminals 69 and the terminal holding part 67.

The first terminal 69 includes a lead part 81 erecting vertically from the substrate 13, and an electric contact part 83 protruding from an upper end of the lead part 81 in parallel to the substrate 13. Among these first terminals 69, a first terminal 69 having the electric contact part 83 on the uppermost row is molded and held by the terminal holding part 67.

The first terminal 69 is a male terminal with the tab-shaped electric contact part 83. Accordingly, a terminal of the first connector 35 connected to the electric contact part 83 of the first terminal 69 is a female terminal 79 (see FIG. 7). That is, the lead part 81 (see FIG. 7) which is one end portion of the first terminal 69 is electrically connected to the substrate 13, and each electric contact part 83 which is the other end portion of the first terminal 69 is electrically connected to the female terminal 79 of each first connector 35 respectively. Therefore, the first terminals 69 are disposed on an upper side of the substrate 13 so that the electrical contact portions 83 are parallel to the substrate 13 and fitted with the plurality of first connectors 35.

In addition to the plurality of first terminals 69 for a power supply system, the first connector fitting part 75 of the present embodiment is provided with a plurality of first terminals 85 for a signal system.

As shown in FIG. 1, the second connector fitting part 77 of the present embodiment includes a second terminal 87 and a shield part 89. The second terminal 87 includes a pair of signal terminals 91, a power supply terminal 93, and a ground terminal 95. The periphery of the pair of signal terminals 91 is surrounded by the square tubular shield part 89. The second connector fitting part 77 is accommodated in the second connector accommodating part 27 formed in the case body 15.

As shown in FIG. 6, a lead part 97 which is one end portion of the signal terminal 91 is electrically connected to the substrate 13, and an electric contact part 99 which is the other end portion of the signal terminal 91 is electrically connected to a terminal (not shown) of the second connector 11. Further, a lead part 101 which is one end portion of the power supply terminal 93 and a lead part 103 which is one end portion of the ground terminal 95 are electrically connected to the substrate 13, and an electric contact part 105 which is the other end portion of the power supply terminal 93 and an electric contact part 107 which is the other end portion of the ground terminal 95 are electrically connected to a terminal of the second connector 11.

In the second terminal 87, the electric contact part 105 and the electric contact part 107 which are the other end portions are disposed on the upper side of the substrate 13, so as to fit with the second connector 11 from a direction (fitting direction A) opposite to the fitting direction B of the first connector 35.

Further, a plurality of electronic components is surface-mounted on the substrate 13.

In the electric distribution box 100 of the present embodiment, the first connector fitting part 75 and the second connector fitting part 77 are aligned in a direction orthogonal to the fitting directions A and B and in a direction (that is, the left-right direction) parallel to the substrate 13. In the electric distribution box 100, at least one of the electronic components is disposed between the first connector accommodating part 39 and the substrate 13, between the second connector accommodating part 27 and the substrate 13, as well as between the second connector accommodating part 27 and the cover 17.

Here, the electronic components are roughly divided into, for example, a low-height electronic component 109 such as a transistor, a middle-height electronic component 111 such as a resistor, and the high-height electronic component 113 such as a diode and a capacitor in an ascending order of height. In this case, in the electric distribution box 100 according to the present embodiment, the low-height electronic component 109 is disposed between the first connector accommodating part 39 and the substrate 13, the middle-height electronic component 111 is disposed between the second connector accommodating part 27 and the substrate 13, and the high-height electronic component 113 is disposed between the second connector accommodating part 27 and the cover body 37 of the cover 17.

As shown in FIG. 7, in the electric distribution box 100 according to the present embodiment, the plurality of first connectors 35 is fitted into the first connector accommodating part 39 in a state where the cover 17 is attached to the case body 15. A gap is formed between the first connector accommodating part 39 and the substrate 13, as well as between the terminal holding part 67 and the cover body 37. The low-height electronic component 109 described above, for example, can be disposed in the gap.

The first terminals 69, 85 protrude from the terminal holding part 67 toward the cover body 37 of the cover 17 by a length that does not protrude from the substrate 13. Further, in a state where the first connector 35 is accommodated in the first connector accommodating part 39 of the cover 17, an electric contact part 115 of the female terminal 79 of the first connector 35 is in a position not protruding from the substrate 13. The relief part 73 is provided in the cover 17 so as to avoid interference with the high-height electronic component 113. With the relief part 73, the electric distribution box 100 is configured such that the high-height electronic component 113 can be disposed by utilizing the height of the substrate accommodating space 23 of the case body 15 to the maximum.

Figure 8:
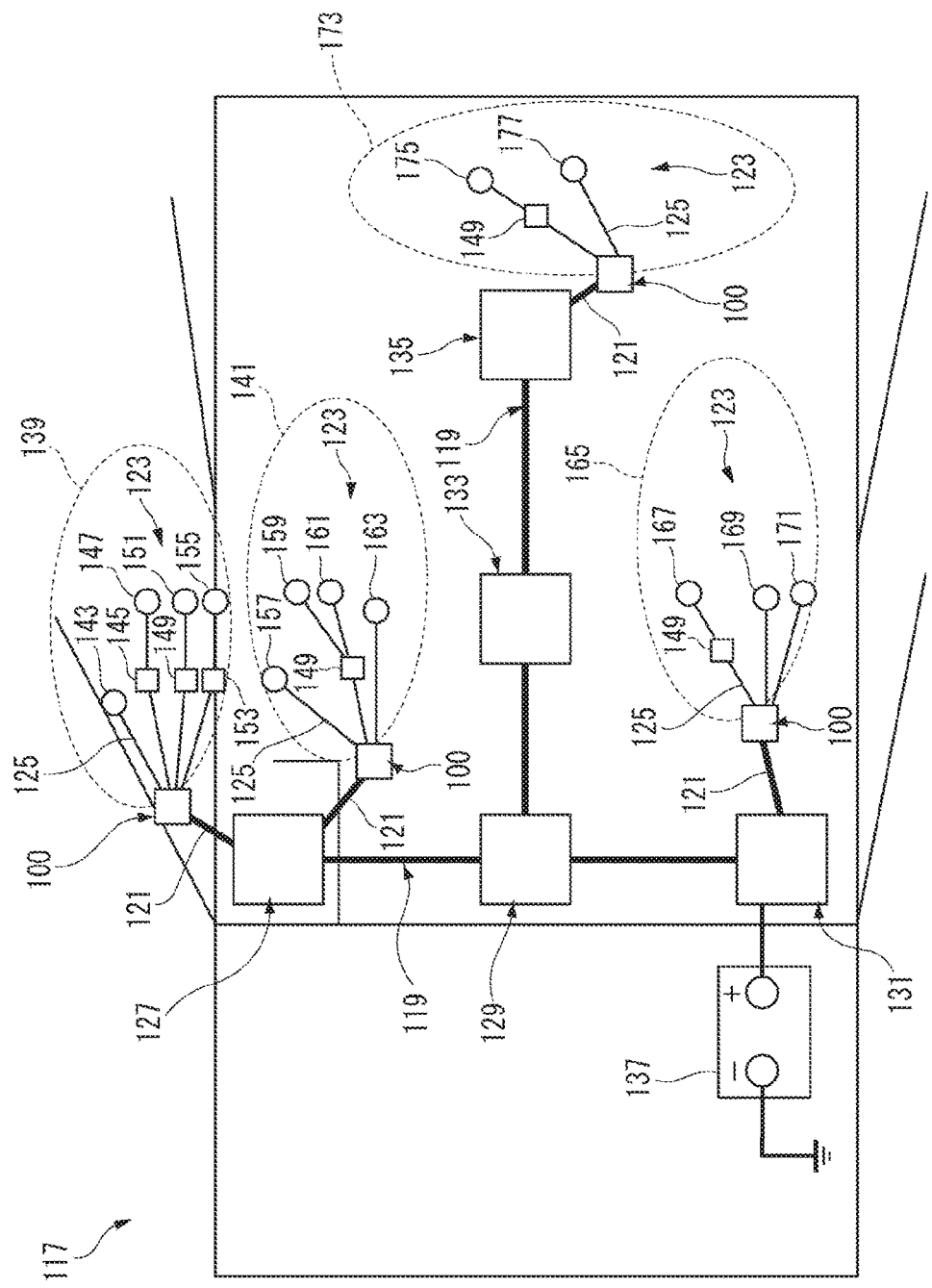
FIG. 8 is a configuration diagram showing an example of an in-vehicle system using the electric distribution box according to the present embodiment.

FIG. 8 is a configuration diagram showing an example of an in-vehicle system 117 using the electric distribution box 100 according to the present embodiment.

In the electric distribution box 100 according to the present embodiment, the second connector 11 is connected to a module cable 121 of a control box connected to at least a trunk line 119 extending in a front-rear direction of a vehicle. Further, the plurality of first connectors 35 are respectively connected to connection cables 125 connected to each auxiliary device 123 of a vehicle module disposed in the vehicle. The electric distribution box 100 can distribute power and signals supplied from the second connector 11 to each auxiliary device 123 via the connection cables 125 connected to respective first connector 35.

In the in-vehicle system 117 as shown in FIG. 8, for example, when an electronic control unit (ECU) (not shown) is the master, the control box can be a slave as a control function part of an electrical equipment. However, when various auxiliary devices 123 are connected under the control box, it is difficult to adopt a large control box, and a number of connectors used for connecting the connection cables 125 may be limited. Therefore, when it is intended to connect a large number of auxiliary devices 123 to one control box, a number of the connectors may be insufficient.

In this case, the electric distribution box 100 of the present embodiment can be used. As described above, the electric distribution box 100 is configured such that one second connector 11 can be connected to an upstream side thereof, and a large number of first connectors 35 which can connect a plurality of devices can be connected to a downstream side thereof.

A PHY circuit, a network switch, a gateway (GW), a processing unit, an interface for CAN-FD, an interface for CXPI, a standard function driver or the like is provided on the substrate 13 of the electric distribution box 100 according to the present embodiment.

Specifically, in the in-vehicle system 117, a plurality of control boxes 127, 129, 131, 133 and 135 are connected to a power source (battery 137) and a main ECU (not shown) via the trunk line 119, for example.

The control box 127 is connected to a door module (vehicle module) 139 via one of two electric distribution boxes 100, and is connected to a floor module (vehicle module) 141 the other one of the two electric distribution boxes 100. The door module 139 includes a door lock motor 143, a master switch 145, a power window motor 147, an E connector 149, a lamp 151, an ECU 153 and an outer mirror 155 as auxiliary devices 123. The floor module 141 includes a curtain switch 157, an E connector 149, an outer mirror switch 159, a seat heater 161 and a hazard switch 163 as auxiliary devices 123.

A roof module (vehicle module) 165 is connected to the control box 131 via the electric distribution box 100. The roof module 165 includes an E connector 149, a roof LED 167, a vanity switch 169 and a vanity lamp 171 as auxiliary devices 123.

A rear module 173 is connected to the control box 135. The rear module (vehicle module) 173 includes an E connector 149, a rear LED 175, a vanity switch 169 and an E latch 177 as auxiliary devices 123.

Accordingly, since the first connector accommodating part 39 for fitting the plurality of first connectors 35 is provided on the downstream side of the electric distribution box 100, a large amount of auxiliary devices 123 can be connected as required. Communication and power supply are controlled by each control box 127, 129, 131, 133, 135 on the upstream side of each electric distribution box 100, but instead of controlled by each control box 127, 129, 131, 133, 135, each electric distribution box 100 can also function as a module driver that incorporates a simple communication function and an output control function, and controls the auxiliary devices 123 of each vehicle module separately.

Next, functions of the above configuration will be described.

In the electric distribution box 100 according to the present embodiment, a plurality of first connectors 35 are fitted to the first connector accommodating part 39 disposed on the cover 17 which is on the opposite side of the bottom wall 25 of the case body 15 to which the second connector 11 is connected, and therefore, fitting work of the first connectors 35 becomes easier compared to a traditional electric distribution box in which all connectors are connected to the same one surface.

Further, since the fitting direction of the first connector 35 with respect to the first connector fitting part 75 is opposite to the fitting direction of the second connector 11 with respect to the second connector fitting part 77, the high-height electronic component 113 with a high height can be disposed at a position aligned in the fitting direction A of the connector with respect to the second connector fitting part 77, and a substrate space of the substrate 13 can be effectively utilized so as to reduce the size.

For example, in a case where the fitting direction of the second connector fitting part 77 shown in FIG. 6 is reversed and is the same as the fitting direction of the first connector fitting part, it is necessary to shift a position of the high-height electronic component 113 such as a diode and a capacitor with a high height to a position not aligned in the fitting direction of the second connector fitting part 77. That is, in a case where the fitting direction A of the second connector 11 with respect to the second connector fitting part 77 is the same as the fitting direction B of the first connector 35 with respect to the first connector fitting part 75, it is necessary to further shift the high-height electronic component 113 to a lower left side in FIG. 6 so as to avoid the fitting direction of the second connector fitting part 77. Therefore, in a case where fitting directions of all connectors are the same, the substrate 13 must be enlarged so as to obtain an area at the lower left side in FIG. 6 where the high-height electronic component 113 is arranged to avoid a collision with the second connector 11.

On the contrary, in the exemplary configuration of the present embodiment, the fitting direction A of the first connector 35 with respect to the first connector fitting part 75 is opposite to the fitting direction B of the second connector 11 with respect to the second connector fitting part 77, so that a sufficient space (that is, relief part 73) capable of disposing the high-height electronic component 113 can be secured on a back surface side (between the second connector fitting part 77 and the cover body 37) of the second connector fitting part 77.

Further, in the electric distribution box 100 according to the present embodiment, the first connector fitting part 75, the second connector fitting part 77 and the electronic components (low-height electronic component 109, middle-height electronic component 111, high-height electronic component 113) are all surface-mounted on the same surface of the substrate 13, so that a terminal or a component does not protrude on a side opposite to the mounting surface, and the case body 15 can be compact in a height direction.

Also, in the electric distribution box 100 according to the present embodiment, the low-height electronic component 109 is disposed between the first connector accommodating part 39 and the substrate 13, the middle-height electronic component 111 is disposed between the second connector accommodating part 27 and the substrate 13, and the high-height electronic component 113 is disposed between the second connector accommodating part 27 and the cover 17, so that a space in the case body 15 can be effectively utilized and the size can be reduced. In particular, as described above, the high-height electronic component 113 whose dimension in the thickness direction of the substrate 13 is larger than other electronic components (low-height electronic component 109 and middle-height electronic component 111) can be disposed between the second connector accommodating part 27 and the cover body 37 of the cover 17.

Further, the electric distribution box 100 according to the present embodiment can distribute, power and signals supplied from the module cables 121 separately connected to the control boxes 127, 129, 131, 133, 135 which are connected to the battery 137 and the main ECU via the trunk lines 119, to connection cables 125 which are connected to the auxiliary devices 123 of each vehicle module in the vehicle. Therefore, a plurality of electric distribution boxes 100 can be used as a common module driver in the in-vehicle system 117, so that it is highly versatile and compact.

Therefore, according to the electric distribution box 100 of the present embodiment, components can be effectively disposed in a relatively small space, and fitting work of each connector becomes easier.

The present invention is not limited to the above-mentioned embodiment, but modifications and applications made by one skilled in the art based on mutual combination of the configurations of the embodiments, description in the specification, and well-known art, is the plan of the present invention and within the scope of protection.

Further, characteristics of the embodiments of the electric distribution box according to the present invention described above are summarized briefly in the following [1] to [3], respectively.

[1] An electric distribution box (100) including:
a substrate (13);
a first connector fitting part (75) which includes a plurality of first terminals (69, 85) and a terminal holding part (67) which holds the plurality of first terminals (69, 85), in which one end portions (lead part 81) of the first terminals are electrically connected to the substrate (13) and the other end portions (electric contact part 83) of the first terminals are configured to be electrically connected to terminals (female terminal 79) of a plurality of first connectors (35) respectively, and the other end portions (electric contact part 83) of the plurality of first terminals (69, 85) are disposed above the substrate (13) so as to fit with the plurality of first connectors (35) in a fitting direction parallel to the substrate (13);
a second connector fitting part (77) which includes a second terminal (87), in which one end portion (lead parts 97, 101, 103) of the second terminal is electrically connected to the substrate (13) and the other end portion (electric contact parts 99, 105, 107) of the second terminal is configured to be electrically connected to a terminal of a second connector (11), and the other end portion (electric contact parts 99, 105, 107) of the second terminal (87) is disposed above the substrate (13) so as to fit with the second connector (11) in a direction opposite to the fitting direction (B) of the first connectors (35);
a plurality of electronic components (low-height electronic component 109, middle-height electronic component 111, high-height electronic component 113) which is surface-mounted on the substrate (13);
a bottomed tubular case body (15) which integrally forms a second connector accommodating part (27) configured to accommodate the second connector (11) on a bottom wall (25) thereof, and accommodates the substrate (13) inserted from a direction same as the fitting direction (B) of the first connectors (35); and
a cover (17) which integrally forms a first connector accommodating part (39) configured to accommodate the plurality of first connectors (35), and closes an opening part (21) of the case body (15).

[2] The electric distribution box (100) according to [1],
in which the first connector fitting part (75) and the second connector fitting part (77) are arranged in a direction orthogonal to the fitting directions (A, B) and in a direction parallel to the substrate (13); and
in which at least one of the electronic components (low-height electronic component 109, middle-height electronic component 111, high-height electronic component 113) is disposed between the first connector accommodating part (39) and the substrate (13), between the second connector accommodating part (27) and the substrate (13), as well as between the second connector accommodating part (27) and the cover (17).

[3] The electric distribution box (100) according to [1] or [2],
in which the second connector (11) is connected to a module cable (121) of a control box (127, 129, 131, 133, 135) connected to a trunk line (119) extending in a front-rear direction of a vehicle;
in which the plurality of first connectors (35) are respectively connected to connection cables (125) respectively connected to auxiliary devices (123) of a vehicle module (door module 139, floor module 141, roof module 165, rear module 173) disposed in the vehicle; and
in which power and a signal supplied from the second connector (11) are distributed to the plurality of first connectors (35) separately.

What is claimed is:
1. An electric distribution box comprising:
a substrate;
a first connector fitting part which includes a plurality of first terminals and a terminal holding part which holds the plurality of first terminals, wherein one end portions of the first terminals are electrically connected to the substrate and the other end portions of the first terminals are configured to be electrically connected to terminals of a plurality of first connectors respectively, and the other end portions of the plurality of first terminals are disposed above the substrate so as to fit with the plurality of first connectors in a fitting direction parallel to the substrate;
a second connector fitting part which includes a second terminal, wherein one end portion of the second terminal is electrically connected to the substrate and the other end portion of the second terminal is configured to be electrically connected to a terminal of a second connector, and the other end portion of the second terminal is disposed above the substrate so as to fit with the second connector in a direction opposite to the fitting direction of the first connectors;
a plurality of electronic components which is surface-mounted on the substrate;

a bottomed tubular case body which integrally forms a second connector accommodating part configured to accommodate the second connector on a bottom wall thereof, and accommodates the substrate inserted from a direction same as the fitting direction of the first connectors; and a cover which integrally forms a first connector accommodating part configured to accommodate the plurality of first connectors, and closes an opening part of the case body.

2. The electric distribution box according to claim 1, wherein the first connector fitting part and the second connector fitting part are arranged in a direction orthogonal to the fitting direction and in a direction parallel to the substrate; and wherein at least one of the electronic components is disposed between the first connector accommodating part and the substrate, between the second connector accommodating part and the substrate, as well as between the second connector accommodating part and the cover.

3. The electric distribution box according to claim 1, wherein the second connector is connected to a module cable of a control box connected to a trunk line extending in a front-rear direction of a vehicle;

wherein the plurality of first connectors are respectively connected to connection cables respectively connected to auxiliary devices of a vehicle module disposed in the vehicle; and wherein power and a signal supplied from the second connector are distributed to the plurality of first connectors separately.

* * * * *